METHOD OF MANUFACTURING SEMICONDUCTOR DEVICES

Filed Nov. 30, 1971

3 Sheets-Sheet 1

United States Patent Office 3,846,167

Patented Nov. 5, 1974

3,846,167

METHOD OF MANUFACTURING SEMICONDUCTOR DEVICES

Hisayuki Higuchi, Kodaira, and Michiyoshi Maki, Kokubunji, Japan, assignors to Hitachi, Ltd., Tokyo, Japan Filed Nov. 30, 1971, Ser. No. 203,384
Claims priority, application Japan, Dec. 4, 1970, 45/106,832
Int. Cl. B44d *1/14, 1/18*
U.S. Cl. 117—212 14 Claims

ABSTRACT OF THE DISCLOSURE

A method of manufacturing semiconductor devices in which a metal layer is deposited on the surface of each of the emitters of a multiplicity of bipolar transistors formed on a semiconductor wafer and each collector thereof is maintained at a positive potential for accomplishing an electrolytic etching, whereby current flows only in those elements whose bases have a lattice defect and whose emitters and collectors are short-circuited, thereby etching off the metal layers on the emitter surface thereof. In this way, the multiplicity of bipolar transistors formed on the wafer, metal layers are retained only on the emitters of qualified elements which are interconnected to obtain integrated circuits or large scale integrated circuits with a high yield rate.

BACKGROUND OF THE INVENTION

Field of the Invention

This invention relates to a method of manufacturing semiconductor devices or more in particular a method of manufacturing semiconductor devices in which disqualified transistors, diodes, resistors and like elements are electrically separated from other qualified elements by electrolytic etching and these qualified elements are interconnected to form semiconductor integrated circuits with a high yield rate.

Description of the Prior Art

Deterioraed electric characteristics of a bipolar transistor are attributable in many cases to insufficient insulation between the collector and emitter. In other words, in order to improve the high-frequency characteristics of the bipolar transistor, it is necessary to minimize the base width. Narrowing the base width to an extreme degree, however, lessens it further, often resulting in a short-circuiting between the collector and emitter due to the lattice defects existing in the Si single-crystal substrate. Even if no short-circuiting occurs between the collector and emitter, it sometimes happens that the PN junctions between the collector and base and between the base and emitter possess no sufficiently high reverse breakdown voltage due to the lattice defects.

This drawback is eliminated by employing an Si single-crystal substrate completely free from lattice defects. At the present level of technological development, however, it is almost impossible to obtain an Si single-crystal substrate completely free from such defects. Nor is there little likelihood of availability of one in the near future.

It is therefore essential to materialize a method of manufacturing bipolar transistors which have superior electric characteristics regardless of some lattice defects, in order to obtain IC's or LSI's, especially, LSI's on slice with bipolar transistors.

For that purpose, what is called the "discretionary method" has been suggested in which electric characteristics of each of a multiplicity of transistors formed on a wafer are measured and only those transistors with satisfactory characteristics are selected and interconnected.

This method, which consists of measuring the characteristics of all of the multiplicity of transistors to produce wiring photo masks of different patterns for different wafers for the purpose of interconnecting only qualified transistors, requires a lot of time and labor and therefore will not be easily commercialized.

This holds true also for such elements as diodes and resistors, and very complicated processes are involved if disqualified elements are to be separated from a multiplicity of diodes and resistors formed on a single wafer and interconnect only qualified elements, posing a great roadblock to the successful production of IC's and LSI's.

SUMMARY OF THE INVENTION

Accordingly, it is an object of this invention to solve the above-mentioned problems and provides a method of manufacturing semiconductor devices with high yield rate including IC's and LSI's comprising a multiplicity of bipolar transistors. diodes and resistors.

In order to achieve this purpose, this invention is characterized by the electrolytic etching process which is used to separate electrically transistors, diodes and resistors with inferior characteristics and to interconnect only those elements with superior characteristics.

DESCRIPTION OF THE PREFERRED EMBODIMENTS

Embodiment 1

Figure 1A:
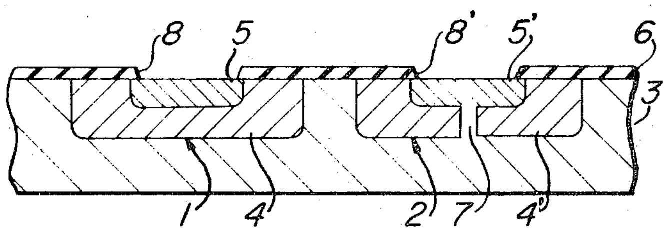
FIGS. 1*a* to 1*d* show partial sections for explaining an embodiment of this invention.

Part of a section of a wafer in which bipolar transistors are formed by an ordinary planar process is shown in FIG. 1*a*. In this figure, the reference numeral 1 shows a qualified transistor with a collector 3, base 4 and emitter 5. Numeral 2 shows a transistor with inferior electric characteristics in which the collector 3 is short-circuited with an emitter 5' through a short-circuit portion 7 in a base 4'. An insulating layer 6 of $SiO_2$ is deposited on the wafer with the transistors 1 and 2. Apertures 8 and 8' for emitter electrodes are created in the insulating layer 6 by a well-known method.

Figure 1B:
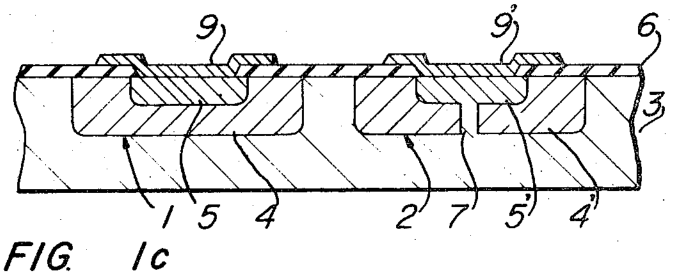

Referring to FIG. 1*b*, aluminum layers 9 and 9' about 6000 A. thick are deposited over the apertures 8 and 8' of the insulating layer 6 respectively. The material which is deposited on the apertures 8 and 8' is not limited to aluminum but may consist of such a good conductor as Ni, Cr or Cu which permits electrolytic etching. The aluminum layers 9 and 9' are formed by an ordinary photoetching process such that each of the layers extends over the insulating layer 3 to make its area larger than that of the apertures 8 or 8' respectively. A photo mask employed is KTFR (made by Kodak), and the photoetching solution consists of 15, 1, 3 and 1 volume parts of phosphoric acid, nitric acid, glacial acetic acid and water respectively.

Figure 1C:
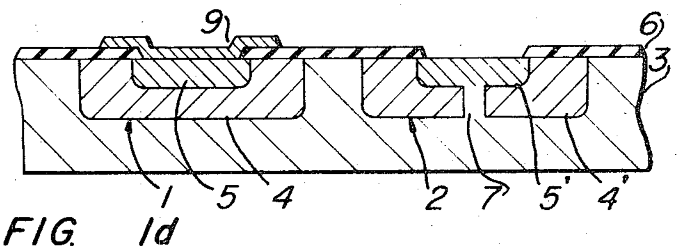
Figure 1D:
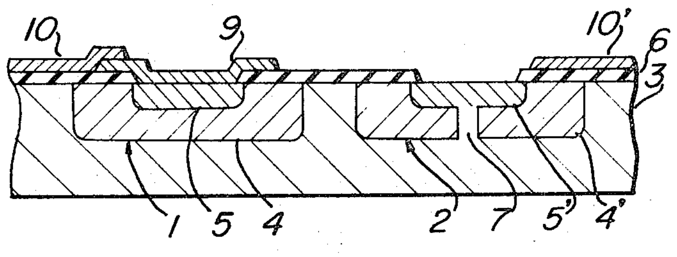

The semiconductor device assembly of the above-described construction is immersed in an electrolytic solution and, in the case of an NPN transistor, a DC voltage equal to or less than the rated reverse breakdown voltage of the PN junctions between the collector 3 and the bases 4 and 4' is applied between the collector 3 and the electrode in the electrolytic solution. Since the transistor 1 is a qualified transistor, no current flows in it and therefore the Al layer 9 is not affected in any manner by the applied voltage. A current flows, however, in the transistor 2 whose collector 5 and emitter 5' are short-circuited, so that the Al layer 9' is etched off into the state as shown in FIG. 1*c*.

Although the above-described treatment concerns the NPN transistor, it is also applicable to a PNP transistor of the applied voltage is made equal to or lower than the rated reverse breakdown voltage between its emitter and base.

As an example, the collector of the NPN transistor which is maintained at a positive potential and a platinum electrode which is maintained at a negative potential are separated from each other and immersed in a 3% caustic potash solution (KOH) to conduct an electrolytic etching for about 20 seconds under the voltage of 3 v. In this case, the Al layer 9' is electrolyzed at the rate of 500 A./sec. or more.

Also, if the applied voltage is made almost equal to the rated reverse breakdown voltage of the PN junction, those transistors with substandard breakdown voltages of their junctions are separated. In other words, by depositing an Al layer on the surface of the base of the NPN transistor, substandard breakdown voltages between the base and collector can be detected.

The Al layer on the base may be either independent of or connected with the Al layer on the emitter.

On completion of the electrolytic etching, Al layers 10 and 10' of desired shapes are deposited for wiring purposes by a well-known method.

In the qualified transistor 1 whose Al layer 9 remains unetched, the wiring 10 is connected through the Al layer 9 to the emitter 5. For the disqualified transistor 2, by contrast, the wiring 10' will not connect with the emitter 5' since the Al layer 9' has been removed by electrolytic etching.

In this way, the depositing of a wiring metal layer after the electrolytic etching makes possible electric separation of disqualified transistors and connection of only qualified transistors without measuring the characteristics of individual transistors.

In the case of an NPN transistor with no Al film deposited on its base or in the case of a PNP transistor, the base and collector are wired for both qualified and disqualified transistors, and therefore the voltage is applied also to the bases and collectors of disqualified transistors during their operation. The manufacturing processes, however, are not adversely affected since the emitters of disqualified transistors have been separated by the electrolytic etching.

In the event of insufficient insulation between the base and collector of the NPN transistor, the metal electrode on its base can be removed by electrolytic etching as in the case of the emitter. Therefore, it is possible to electrically separate not only the emitter but the base for the NPN transistor.

Embodiment 2

Figure 2A:
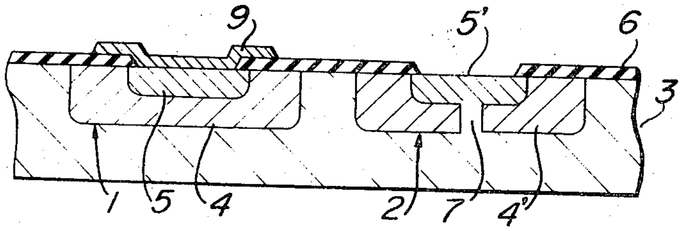
FIGS. 2*a* to 2*c* show partial sections for explaining another embodiment of this invention.

FIG. 2*a* shows the assembly in which the Al layer has been removed from the surface of emitter 5' of the transistor 2 with disqualified characteristics through the processes shown in FIGS. 1*a* to 1*c*.

Figure 2B:
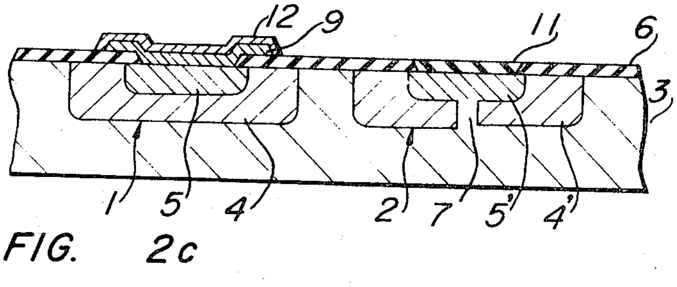

As the next step, the assembly is immersed in an aqueous solution comprising 1% tartaric acid and 3% ammonium tartrate and a voltage higher than the specified maximum reverse breakdown level of the transistor is applied for oxidization of its positive electrode. In the event that the applied voltage for oxidization of the positive electrode exceeds the rated reverse breakdown voltage level of the transistor, a reverse current flows also in qualified transistors. As a result, the $SiO_2$ 11 and $Al_2O_3$ 12 are formed respectively, as shown in FIG. 2*b*, on the exposed surface of the emitter 5 of the disqualified transistor 2 and on the surface of the Al layer 9 deposited on the emitter 5 of the qualified transistor 1. As an example, when the voltage of 50 v. is applied for about 20 minutes to oxidize the positive electrode, the $SiO_2$ and $Al_2O_3$ layers formed on the emitter 5' and the Al layer 9 respectively have the thickness of about 500 A. and 700 A.

Following the oxidization of the positive electrode, the assembly is immersed in a mixture solution comprising 10 g. chromium trioxide, 15 ml. phosphoric acid and 500 ml. water, whereby although the $SiO_2$ layer 11 is not affected, the $Al_2O_3$ layer 12 is dissolved, exposing the Al layer 9. Chromic acid may be used instead of the chromium trioxide. The $Al_2O_3$ film is dissolved at the rate of 90 A. per minute at the etching solution temperature of about 90° C. Under such conditions, the Al layer is etched very little, offering no practical problem.

Figure 2C:
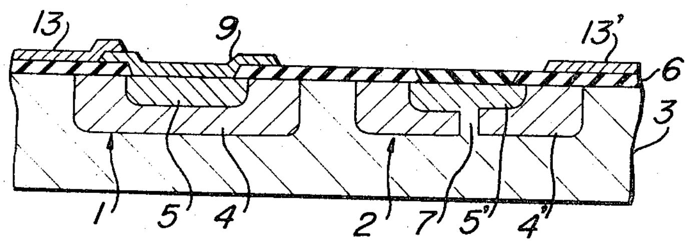

The metal wiring 13 is then deposited by a well-known method. And the emitter 5 of the qualified transistor 1 is connected with the metal wiring 13 through the Al layer 9, as shown in FIG. 2*c*, but the emitter 5' of the disqualified transistor 2 is not connected with the metal wiring 13', thus making possible selective connection of only the emitter of the qualified transistor.

Figure 2D:
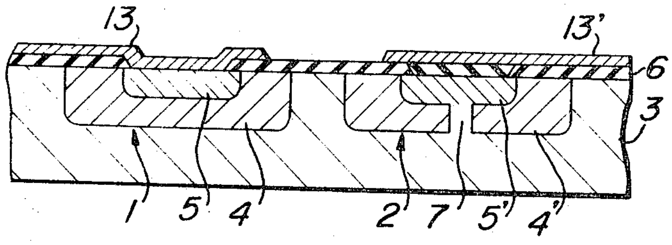

In the event that hot phosphoric acid 180° C. in temperature is employed as an etching solution for the above purpose, the Al layer 9 is dissolved, together with the $Al_2O_3$ layer 12. The result is formation of the wiring 13 directly connected with the emitter 5 with little difference in height as shown in FIG. 2*d*.

The integrated circuit formed in this way has such superior properties that the proximity between emitters in a highly integrated circuit arrangement which otherwise might give rise to leakage currents does not impair the semiconductor device due to the fact that the surface of the emitter 5 of the disqualified transistor 2 is insulated by $SiO_2$ 11.

By maintaining the applied voltage for positive electrode oxidization at or lower than the rated reverse breakdown voltage of the elements, current is made to flow only in disqualified elements. As a result, an oxide layer is formed by the oxidization of the positive electrode in the form of only the $SiO_2$ layer 11, and the $Al_2O_3$ layer 12 is not formed. This eliminates the need of any special process for removing the $Al_2O_3$, contributing to the simplification of manufacturing processes.

Embodiment 3

Figure 3:
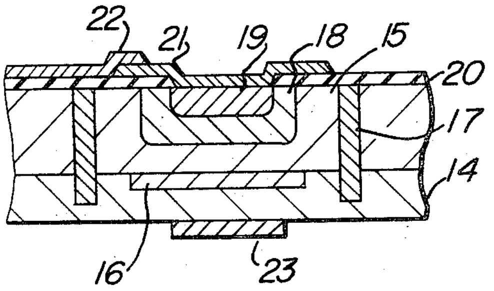
FIG. 3 is a diagram showing a partial sectional view of an embodiment of this invention applied to an IC or LSI.

Still another embodiment of the invention as applied to the IC or LSI is illustrated in FIG. 3. In this drawing, the reference numeral 14 shows a P-type Si substrate, numeral 15 an N-type epitaxial layer grown on the substrate 14, which is used as a collector. Numeral 16 shows an $N^+$-type buried region, numeral 17 a $P^+$-type isolation region, numeral 18 a P-type base region, numeral 19 an N-type region, numeral 20 a $SiO_2$ layer, numeral 21 an Al layer and numeral 22 a metal wiring.

In forming an IC or LSI, a high-conductivity metal 23 such as made of Cu is closely attached to the substrate 14, so that the positive potential is applied through the PN junction to the metal layer 21, which is used as an electrode for performing electrolytic etching as in the embodiment 1 and embodiment 2. When the collector 15 and emitter 19 are short-circuited, the Al layer 21 is removed. On the other hand, when they are not short-circuited, the Al layer 21 remains unremoved which permits connection by the use of the metal wiring 22. Also, as in the embodiment 2, it is needless to say that the degree of integration is improved by oxidization following the electrolytic etching.

As can be seen from the above description, the method according to the invention facilitates accurate connection of qualified transistors and elimination of other transistors with substandard electric properties which have heretofore required a great amount of time and labor.

When a plurality of transistors with a small area are formed according to this method, those transistors among them which possess substandard properties are electrically screened off, while qualified ones are automatically wired, with the result that a single large-capacity transistor is obtained from the selected qualified transistor elements.

For instance, if each transistor making up an IC is made to consist of a plurality of smaller transistor elements, connection of the small transistor elements always results in the successful formation of each transistor incorporated in the IC, thereby improving the IC yield remarkably, so far as all of the plurality of small transistors are not below the standard.

Elimination of disqualified transistors and connection of only qualified transistors allows a larger area to be occupied, which might seem to lead to reduction in the degree of integration. Such a reduction, however, does not occur as is apparent from the example explained below.

In this connection, the explanation refers to a case in which the base and emitter regions of a power transistor are formed by combining a plurality of small regions.

The physical size of a pellet of the power transistor depends on its radiation characteristic. For the 80-watt transistor 2SC 898, as an example, the maximum rated current of 7 A. for the collector and the pellet size of 5 mm. by 5 mm. are employed. Since a transistor with the base area of $50\mu$ by $30\mu$ admits the collector current up to 20 ma., it is seen that the power transistor which meets the above specifications is capable of being formed by combining 350 small transistors.

Assuming that a multiplicity of transistors with the base area of $50\mu$ by $30\mu$ are formed at positions $60\mu$ and $40\mu$ apart lengthwise and breadthwise respectively, it follows that approximately $10^4$ transistors can be contained on a pellet of 5 mm. by 5 mm., showing that no reduction in integration degree is achieved.

The present invention, by contrast, has the merit of a markedly improved the yield of IC's and LSI's compared with the prior art methods.

In a conventional method, for example, the yield of only 70% is achieved in manufacture of ordinary IC's comprising 50 transistors, in which case the proportion that qualified transistors occupy of all transistors is calculated to be 98%.

In the event that the emitter of each transistor is divided into four emitter portions so that the characteristics of the transistor may not fall below standard unless more than three emitter portions are disqualified, 99.5% of the divided emitters are qualified. This case concerns division of an emitter into four portions with a common base. But the same advantage is also obtained by dividing the base into four portions.

Because of the division into four portions, the probability of a given transistor being qualified is $$(0.995)^4+4\times(0.995)^3\times(0.005)=0.99985.$$

It will be seen from this figure that the proportion disqualified transistors occupy of all transistors produced is reduced from 2% for the conventional manufacturing method by about two orders to 0.015% for the present invention.

Embodiment 4

The preceding embodiment is an application of the invention to the bipolar transistor. The invention, however, is not limited to the bipolar transistor but finds application also in other elements including diodes and resistors. The following explanation is made about application of the invention to the diode and resistor.

It is needless to say that it is better the higher the reverse breakdown voltage of a diode. The reverse breakdown voltage of a diode is determined by the concentration of impurities in P-type and N-type regions constituting a PN junction and it is reduced according as the impurities concentration rises.

In order to reduce the resistance in the forward direction, it is necessary to raise the impurities concentration while maintaining the reverse breakdown voltage at or above the rated level. Increasing the impurities concentration, however, often develops a diode which does not satisfy the rated value due to lattice defects. This is especially true for a large-current diode with a large area, constituting one of the great factors contributing to a reduced yield.

According to the present invention, diodes with inferior properties, as in the case of the bipolar transistors explained above, are easily eliminated electrically. For this purpose, a layer of material which permits electrolytic etching such as Al is deposited or part of the P-type region of a diode and a voltage equal to the predetermined reverse breakdown level is applied to the diode for electrolytic etching. If the diode has a reverse breakdown voltage equal to or higher than the rated value, the Al layer undergoes no change. However, in the event of the reverse breakdown voltage of the diode being below the rated value, the Al layer is dissolved for removing off for electrical separation of substandard diodes.

Embodiment 5

Figure 4:
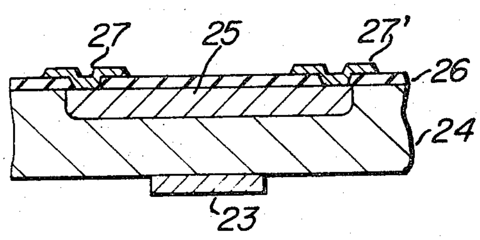
FIG. 4 is a diagram showing a partial sectional view of an embodiment of this invention applied to a resistor.

This invention is also applicable to separation of resistors with a substandard breakdown voltage. In the manufacture of an IC, it is common practice, as shown in FIG. 4, to form a region 25 with an opposite conductivity from a substrate 24 by diffusion or other well-known methods. Aluminum layers 27 and 27' are formed in the apertures of the $SiO_2$ layer 26 deposited on the resistor 25. Under these conditions, the electrode 23 is brought into close contact with the substrate thereby to accomplish an electrolytic etching.

When the resistor 25 and the substrate 24 are separated from each other sufficiently to prevent current flow, the Al layer 27 remains unchanged. On the other hand, if they are not well separated, the Al layer 27 is removed off to separate the resistor 27 electrically.

Accordingly, as in the case of the above-described bipolar transistors, this invention offers a method in which resistors with high breakdown voltages can be formed accurately by combining a plurality of small resistors into a single large resistor, thereby greatly improving the yield of integrated circuits.

It will be understood from the above detailed explanation that according to the invention it is possible to separate elements with inferior characteristics among a multiplicity of transistors, diodes and resistors while at the same time connecting qualified elements in a single process. In addition, each of such elements comprises a plurality of smaller elements, thereby remarkably improving the yields of not only individual elements but IC's or LSI's produced by combining such elements.

What is claimed is:

1. A method of manufacturing a semiconductor device comprising the steps of (a) providing a semiconductor substrate comprising at least one NPN transistor and an insulating layer having apertures for exposing part of the emitter region and base region of said transistor, respectively, said insulating layer covering said transistor, (b) forming a metal layer on said exposed emitter region and on said exposed base region, respectively, and on at least a portion of said insulating layer adjacent said exposed regions, said metal layers being capable of being etched electrolytically, (c) immersing said substrate and an electrode apart from each other in a solution capable of electrolytically etching said metal layer, and applying a predetermined magnitude of voltage between the collector of said transistor and said electrode for a predetermined period of time in such a direction as to maintain said collector positive with respect to said electrode, thereby accomplishing an electrolytic etching process, said voltage being relatively high but sufficiently low to apply to the PN junction between said collector and said base a voltage not exceeding the rated reverse breakdown voltage of said PN junction, said period of time being so long that said metal layers are electrolytically etched by a current which flows when said PN junction is ruptured by said applied voltage; whereby the metal layers on the emitter and the regions are retained or removed depending on whether said PN junction is capable of enduring said applied voltage.

(d) and forming on said insulating layer wiring conductor layers having a portion extending to a point where said wiring conductor layers are capable of connecting with the retained metal layers respectively on the base and emitter regions whereby the conductor layers are connected only with the base and emitter regions of the transistor whose PN junction between said collector and base regions is capable of enduring said rated reverse breakdown voltage.

2. A method of manufacturing a semiconductor device comprising the steps of (a) providing a semiconductor substrate comprising at least one semiconductor element therein forming at least one PN junction, said semiconductor element including a first semiconductor region of a first type of conductivity and a second semiconductor region formed within said first semiconductor region and having a second type of conductivity, opposite said first type of conductivity, an insulating layer covering said semiconductor element and being provided with an aperture therethrough, exposing a portion of said second semiconductor region, (b) forming, on said exposed portion of said second semiconductor region, a metal layer which is capable of being electrolytically etched, (c) immersing said substrate and an electrode apart from each other in a solution capable of electrolytically etching said metal layer, exposing said metal layer to said solution and applying a predetermined magnitude of voltage between said electrode and said second semiconductor region across said PN junction for a predetermined period of time in such a direction as to maintain said metal layer positive with respect to said electrode, said applied voltage being relatively high but sufficiently low to apply to said PN junction a voltage not exceeding the rated reverse breakdown voltage of said PN junction, said period of time being so long that said metal layer is electrolytically etched off by a reverse current which flows through said PN junction due to said applied voltage when the reverse breakdown voltage of said PN junction is lower than the rated reverse breakdown voltage level; whereby said metal layer formed on said second semiconductor region is retained or removed depending on whether said PN junction between said first and second semiconductor regions is capable of enduring said applied voltage, (d) immersing said substrate and an electrode apart from each other in an electrolytic solution which oxidizes said substrate as a positive electrode, and applying a predetermined magnitude of voltage between the immersed electrode and said second semiconductor region through said PN junction for a predetermined period of time in such a direction that said first semiconductor region is maintained positive with respect to said electrode; whereby in the event of said semiconductor element being disqualified, oxide layers are formed on both said exposed second region and the retained metal layer by anodic oxidation, said second semiconductor region geing exposed by the electrolytic etching of said metal layer, (e) immersing said substrate in a solution which is capable of dissolving only said metal and said oxide layer of said metal, thereby removing said metal and said oxide layer of said metal, (f) and forming on said insulating layer a wiring conductor having a portion capable of being extended over said second semiconductor region; whereby said extended portion is formed on said second semiconductor region exposed by the foregoing step (e), in the event of said semiconductor element being a qualified element, thereby connecting said wiring conductor layer only with the qualified semiconductor element.

3. A method of manufacturing a semiconductor device comprising the steps of (a) providing a semiconductor substrate having at least one semiconductor element therein, said element comprising a first semiconductor region of a first conductivity type and a second semiconductor region of a second conductivity type, opposite said first conductivity type, formed within said first semiconductor region, thereby forming a PN junction therebetween, with an insulating layer covering said at least one semiconductor element and having an aperture therethrough exposing a portion of said second semiconductor region, (b) forming a metal layer on said exposed portion of said second semiconductor region and on at least a portion of said insulating layer adjacent said exposed portion, said metal layer being capable of being electrolytically etched off, (c) immersing said substrate and an electrode at a certain distance from each other in a solution for electrolytically etching said metal layer, exposing said metal layer to said solution and applying a predetermined magnitude of voltage for a predetermined period of time between said electrode and said second semiconductor region across said PN junction in such a direction as to maintain said metal layer and said electrode at positive and negative potentials respectively; said magnitude of said voltage being relatively high but sufficiently low to apply to said PN junction a voltage lower than the rated reverse breakdown voltage level of said PN junction, said period of time being sufficient long to electrolytically etch off said metal layer by the flow of a reverse current caused by said applied voltage in the event that the reverse breakdown voltage of said PN junction is lower than said rated reverse breakdown voltage level; whereby said metal layer on said second semiconductor region is retained or removed depending on whether said PN junction between said first and second semiconductor regions is capable of enduring said applied voltage, (d) and forming on said insulating layer a wiring conductor layer having a portion adapted to be extended to a position where said portion is capable of connecting said metal layer retained on said insulating layer, whereby said wiring conductor layer is connected only with said second semiconductor region which is associated with a PN junction capable of enduring said rated reverse breakdown voltage level, said second semiconductor region being separated from said first semiconductor region by said PN junction.

4. A method of manufacturing a semiconductor device according to claim 3, in which said metal layer consists of a metal selected from the group consisting of Al, Ni, Cr and Cu and said electrolytic etching solution consists of an aqueous solution of caustic alkali.

5. A method of manufacturing a semiconductor device according to claim 3, further comprising the step of immersing, in an electrolytic solution which oxidizes said further as a positive electrode, an electrode and said substrate on completion of said electrolytic etching step (c) and apply a predetermined magnitude of voltage for a predetermined period of time between said electrode and said second semiconductor region across said first semiconductor region in such a direction that said electrode and said first semiconductor region are maintained at negative and positive potentials respectively; whereby an oxide layer is formed by said oxidization of said positive electrode on the second semiconductor region of a disqualified semiconductor element whose metal layer has been removed by said electrolytic etching step (c), thereby protecting said disqualified semiconductor element.

6. A method of manufacturing a semiconductor device according to claim 5, in which said electrolytic solution for oxidizing said positive electrode consists of an aqueous solution containing 1% tartaric acid and 3% ammonium tartrate by weight.

7. A method of manufacturing a semiconductor device according to claim 5, in which said voltage for oxidization of said positive electrode is lower than said rated reverse breakdown voltage level of said PN junction of said semiconductor element.

8. A method of manufacturing a semiconductor device according to claim 7, further comprising the step of treating in an acid mixture solution capable of dissolving said oxide layer, thereby removing said oxide layer which may be formed on said metal layer of a qualified semiconductor element by said voltage for oxidizing said positive electrode.

9. A method of manufacturing a semiconductor device according to claim 8, in which said acid mixture solution consists of an aqueous solution comprising phosphoric acid and a compound selected from the group consisting of chromium trioxide and chromic acid.

10. A method of manufacturing a semiconductor device comprising the steps of (a) providing a semiconductor substrate having at least one transistor therein and an insulating layer which covers said transistor, said insulating layer having an aperture therethrough exposing a portion of the emitter region of said transistor, (b) forming a metal layer on the surface of said exposed emitter region of said transistor and on at least a portion of said insulating layer adjacent said exposed portion, said metal layer being capable of being etched electrolytically, (c) immersing said substrate and an electrode apart from each other in a solution capable of electrolytically etching said metal layer, and applying a predetermined magnitude of voltage between the collector of said transistor and the electrode for a predetermined period of time in such a direction as to maintain said collector at a positive potential with respect to said electrode, thereby accomplishing electrolytical etching of the metal layer on disqualified elements, said voltage being relatively high but sufficiently low to apply to one of the PN junctions between the collector and base and between the base and emitter of said transistor a voltage not exceeding the rated reverse breakdown voltage level of said PN junctions, said predetermined period of time being so long that said metal layer is electrolytically etched off by a current that flows when a PN junction is ruptured by said applied voltage; whereby said metal layer on said emitter region is retained or removed depending on whether a PN junction is capable of enduring said voltage, (d) and forming on said insulating layer a wiring conductor layer having a portion extending to such a position as to be in contact with said metal layer retained on said insulating layer, whereby said wiring conductor layer is coupled only with the emitter of a transistor having a PN junction capable of enduring said rated reverse breakdown voltage.

11. A method of manufacturing a semiconductor device according to claim 10, in which said substrate has a plurality of transistors having at least one collector region, a plurality of base regions formed inside of said collector region and a plurality of emitter regions each formed inside of each of said base regions, said collector region being common to said plurality of transistors, said aperture in said insulating layer exposing a portion of the emitter of each of said transistors, said metal layer being deposited on said exposed emitter portion of each of said transistors; whereby a metal layer formed on the emitter of a transistor whose reverse breakdown voltage is below the rated breakdown level is removed by said electrolytic etching, thereby connecting said wiring conductor layer only with said retained metal layer.

12. A method of manufacturing a semiconductor device according to claim 10, in which said substrate has a plurality of transistors having at least one collector region, a base region formed inside of said collector region and a plurality of emitter regions, said collector and said base being common to said plurality of transistors, said aperture in said insulating layer exposing a portion of each of said emitter regions, said metal layer being deposited on said exposed emitter portion of each of said emitter regions, whereby said metal layer retained on each disqualified transistor is removed by said electrolytic etching, thereby connecting said wiring conductor layer only with the metal layer on the emitter region of the retained qualified transistor.

13. A method of manufacturing a semiconductor device according to claim 10, in which said substrate comprises a first semiconductor layer of a first type of conductivity, a second semiconductor layer formed on said first semiconductor layer and having a second type of conductivity, opposite said first type of conductivity, and an isolation semiconductor region of said first type of conductivity which passes from the surface of said second semiconductor layer through said second semiconductor layer to said first semiconductor layer and divides said second semiconductor layer into a plurality of regions, each of said plurality of transistors being incorporated in each of said plurality of regions of said second semiconductor layer.

14. A method of manufacturing a semiconductor device according to claim 13, in which said first semiconductor layer is P-type and said positive potential for electrolytic etching is applied from said first semiconductor layer to said second semiconductor layer.

References Cited

UNITED STATES PATENTS

| | | | |
|---|---|---|---|
| 3,379,625 | 4/1968 | Csabi | 204—129.3 X |
| 3,010,885 | 11/1961 | Schink | 204—129.3 X |
| 3,518,131 | 6/1970 | Glendinning | 204—129.3 X |
| 3,649,488 | 3/1972 | Pitetti et al. | 204—129.3 |
| 3,536,600 | 10/1970 | Van Dijk et al. | 204—129.1 |
| 3,616,348 | 10/1971 | Greig | 204—129.3 |
| 3,689,389 | 9/1972 | Waggener | 204—32 S |

CAMERON K. WEIFFENBACH, Primary Examiner

U.S. Cl. X.R.

29—574; 117—8, 217; 204—32 S, 129.2, 129.3